(12) United States Patent
Conso et al.

(10) Patent No.: US 11,523,198 B2
(45) Date of Patent: Dec. 6, 2022

(54) OTP PROGRAMMABLE MICROPHONE ASSEMBLY

(71) Applicant: Knowles Electronics, LLC, Itasca, IL (US)

(72) Inventors: Fabrizio Conso, Frederiksberg (DK); Tore Sejr Jørgensen, Taastrup (DK)

(73) Assignee: Knowles Electronics, LLC, Itasca, IL (US)

( * ) Notice: Subject to any disclaimer, the term of this patent is extended or adjusted under 35 U.S.C. 154(b) by 306 days.

(21) Appl. No.: 16/858,662

(22) Filed: Apr. 26, 2020

(65) Prior Publication Data

US 2020/0344538 A1    Oct. 29, 2020

Related U.S. Application Data

(60) Provisional application No. 62/840,375, filed on Apr. 29, 2019.

(51) Int. Cl.
| | |
|---|---|
| *H04R 1/04* | (2006.01) |
| *H03H 1/00* | (2006.01) |
| *H02H 7/20* | (2006.01) |
| *H03H 7/06* | (2006.01) |
| *H03H 1/02* | (2006.01) |

(52) U.S. Cl.
CPC ............ *H04R 1/04* (2013.01); *H02H 7/20* (2013.01); *H03H 1/0007* (2013.01); *H03H 1/02* (2013.01); *H03H 7/06* (2013.01)

(58) Field of Classification Search
CPC .......... H04R 1/04; H02H 7/20; H03H 1/0007; H03H 1/02; H03H 7/06

USPC .......................................................... 381/355
See application file for complete search history.

(56) References Cited

U.S. PATENT DOCUMENTS

| | | |
|---|---|---|
| 6,985,598 B1 | 1/2006 | Joschika |
| 9,054,223 B2 | 6/2015 | Albers |
| 10,028,054 B2 | 7/2018 | Furst et al. |
| 2009/0184770 A1* | 7/2009 | Li .................. H03H 11/1291 330/296 |

(Continued)

FOREIGN PATENT DOCUMENTS

| | | |
|---|---|---|
| WO | 2017030891 A1 | 2/2017 |
| WO | 2017143177 A1 | 8/2017 |

*Primary Examiner* — Hafizur Rahman
(74) *Attorney, Agent, or Firm* — Loppnow & Chapa; Matthew C. Loppnow

(57) ABSTRACT

The present disclosure relates to devices and methods for programming one-time programmable fuses of microphone assemblies. One microphone assembly includes a housing, a transducer, a filter circuit, and an integrated circuit. The integrated circuit has a fuse block having a one-time programmable (OTP) fuse configurable in a programming mode of operation during which a voltage applied to the supply voltage contact is increased relative to a voltage applied to a supply voltage contact in a normal mode of operation. The microphone assembly further includes a protection circuit configured to regulate a voltage at the voltage input terminal of the integrated circuit during the programming mode of operation based on a comparison of a voltage at the voltage input terminal with a reference voltage. The voltage on the voltage input terminal of the integrated circuit tracks the reference voltage during the programming mode of operation.

20 Claims, 8 Drawing Sheets

(56) References Cited

U.S. PATENT DOCUMENTS

2009/0303650 A1\* 12/2009 Do ..................... G11C 29/50
361/93.7
2015/0256916 A1   9/2015 Volk et al.

\* cited by examiner

OTP PROGRAMMABLE MICROPHONE ASSEMBLY

TECHNICAL FIELD

The present disclosure relates generally to microphone assemblies and more particularly to one-time programmable microphone assemblies, electrical circuits and methods therefor.

BACKGROUND

Microphone assemblies comprising a transducer (e.g., a capacitive MEMS transducer) and an ASIC disposed within a housing including a host interface with electrical contacts for integration in a host device are known generally. Such microphones are used in mobile communication devices and personal computers among other consumer and industrial devices. It is desirable to suppress electromagnetic interference (EMI) in such microphone assemblies. Such microphone assemblies are often calibrated postproduction to meet desired performance or operational specifications, for example, sensitivity. The calibration is fixed by burning one or more fuses of one-time programmable (OTP) memory on-board the ASIC. Burning the fuses, however, creates large current spikes, and supply impedance associated with an RF filter reduces the instantaneous voltage supplied to the ASIC. Thus while the RF filter suppresses EMI it also interferes with reliable burning of the OTP fuses. The problem is aggravated in applications that require larger RF filter impedances to comply with stringent EMI suppression requirements.

BRIEF DESCRIPTION OF THE DRAWINGS

The foregoing and other features of the present disclosure will become more fully apparent from the following description and appended claims, taken in conjunction with the accompanying drawings. These drawings depict only several embodiments in accordance with the disclosure and are, therefore, not to be considered limiting of its scope. Various embodiments are described in more detail below in connection with the appended drawings.

Figure 1:
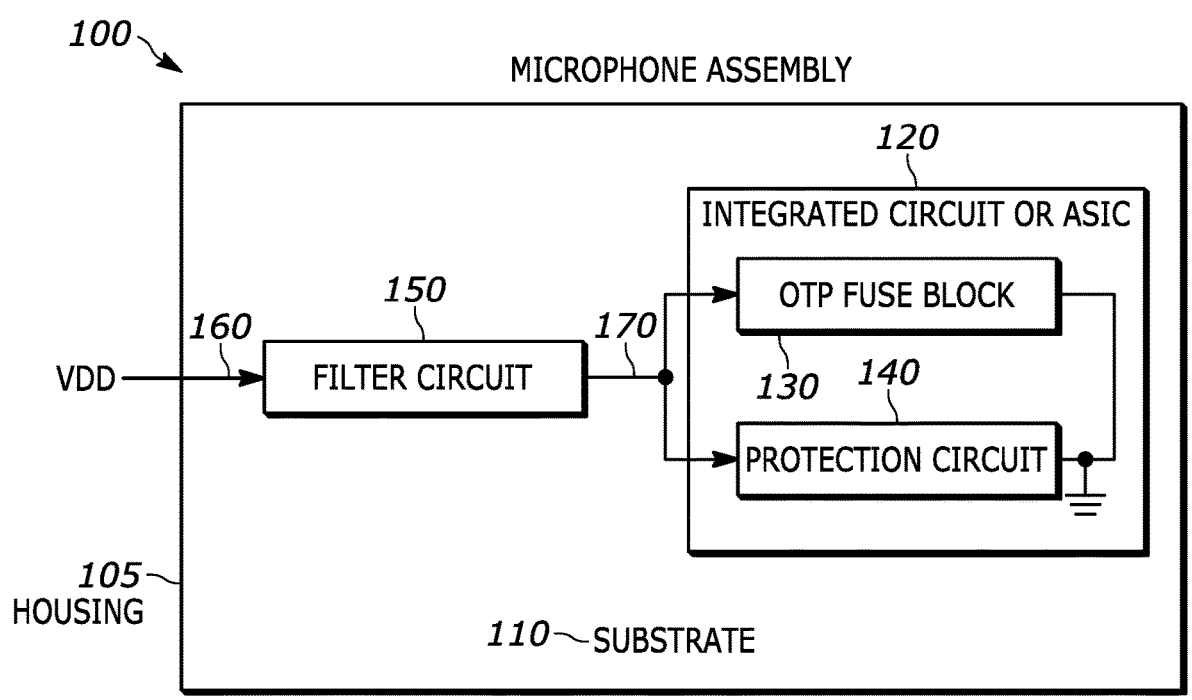
FIG. 1 is a block diagram of an example microphone assembly in which a protection circuit is placed in parallel to a fuse block.

In the following detailed description, various embodiments are described with reference to the appended drawings. The skilled person will understand that the accompanying drawings are schematic and simplified for clarity and therefore merely show details which are essential to the understanding of the disclosure, while other details have been left out. Like reference numerals refer to like elements or components throughout. Like elements or components will therefore not necessarily be described in detail with respect to each figure.

DETAILED DESCRIPTION

Ideally, a microphone should detect only acoustic activity. However, a microphone in the real world picks up various kinds of noise from RF interference by being in the proximity of devices that may be sources of RF interference. If the RF interference is not suppressed, then it may lead to undesirable audible noise at the output of the microphone; for example, a humming or a buzzing sound may be introduced.

Microphones may have an integrated circuit (e.g., an application specific integrated circuit, or ASIC) in the microphone assembly. The integrated circuit receives an electrical signal from an acoustic transducer and processes (e.g., amplifies or conditions) the signal before outputting a digital or analog electrical signal representative of the sensed acoustic activity. The integrated circuit in a microphone may include a form of read-only memory (ROM), such as a one-time programmable (OTP) memory. The OTP memory may be programmed after implementation in the microphone assembly package to calibrate various parameters of the microphone during production trimming, e.g., the calibration of parameters related to the sensitivity of the microphone. In some embodiments, the OTP memory is made of a fuse block of one or more fuses (e.g., polysilicon fuses). The OTP fuses are programmed by applying a high enough voltage across them to cause a sufficient current to flow through the fuses to program, or "burn in", the fuses.

In some implementations, RF suppression of a microphone is enhanced using a filter circuit (alternatively referred to herein as a package RF-filter) on the input terminals. For example, a first-order R-C filter circuit could be placed at one or more of the input terminals of the microphone assembly which are connected to power supply voltage signals. This filter circuit may be placed on the substrate of the microphone during the packaging of the microphone or, in some embodiments, some or all of the filter circuit may be embedded within layers of the substrate. The impedance offered by the filter circuit is referred to herein as the package filter impedance. In some embodiments, the RF suppression of the microphone is improved by introducing a higher resistance in series with the input terminals of the microphone package that receive input power from a power supply. It may be more feasible to increase resistance, rather than capacitance, and maintain a relatively small overall microphone assembly footprint due to the generally larger size occupied by larger capacitors.

However, increasing the package filter impedance at the input terminals can present problems for reliable programming of the OTP memory on the integrated circuit. The placement of a package filter impedance in series with the fuse block means that the input voltage from the power source will be divided between the package filter impedance and the fuse block, resulting in reduced voltage across the fuse block. As the package filter impedance is increased to improve RF suppression, the voltage drop across the filter impedance increases, and the voltage across the fuse block decreases. The writing operation of the fuses (e.g., polyfuses) of the OTP memory requires large current spikes to successfully burn the fuses. The reduced instantaneous supply voltage level on the fuse block due to the large package filter impedance causes at best an unreliable burning of the poly-fuses of the fuse block. This problem manifests itself only after the package filter impedance has been increased beyond a limit which prevents a reliable writing operation of the OTP fuses. Until that limit of the package filter impedance is reached, the writing operation of the OTP fuses may proceed without any special provisions.

The present disclosure provides apparatus and methods designed to allow successful writing of OTP fuses in a microphone assembly that utilizes increased filter impedances. One way to compensate for the higher package filter impedance is to apply a higher input voltage. A side effect of applying an increased VDD voltage is that the integrated circuit is exposed to a higher voltage level after the OTP fuses break down, which may cause damage to the circuitry inside the integrated circuit. In some implementations, the limit for the maximum voltage tolerated by an integrated circuit may be as low as 3.6V. Applying a higher voltage may result in shortening the lifetime of the integrated circuit, and in some cases might cause serious damage to the circuits in the integrated circuit.

In some implementations of the present disclosure, a protection circuit is provided in parallel to the fuse block that includes a variable impedance dummy load and a comparison circuit. The protection circuit may be part of the integrated circuit or a separate circuit disposed between the filter circuit and the integrated circuit. The protection circuit ensures that the maximum voltage on the input terminal to the integrated circuit is capped to a safe value that is well tolerated by the integrated circuit. The protection circuit controls the dynamic sharing of the current flowing into the parallel combination of the fuse block and the dummy load in such a way that the OTP fuses draw sufficient current for a desired period of time for successful writing of the OTP fuses. Upon completion of the writing operation, the protection circuit directs most or substantially all of the current to the dummy load, thus protecting the integrated circuit from damage.

In some example implementations, an impedance reduction circuit is introduced in the integrated circuit which is configured to reduce the effect of increased package filter impedance. In some implementations, one or more impedances are switched into a parallel configuration with a series impedance between the primary voltage input and the fuse block during a writing operation. The impedances are sufficient in size to reduce the effective series impedance to below a threshold value for successfully performing the writing operation. In such implementations, the writing operation can be performed without providing additional protection circuitry for the integrated circuit.

In some other implementations, impedance bootstrapping is achieved with the help of external components. The bootstrapping circuit works to regulate the voltage on the voltage input terminal of the integrated circuit to track a reference voltage during the programming mode of operation, thus leading to reliable programming of the OTP fuse block.

FIG. 1 is a block diagram of an example microphone assembly 100, according to some embodiments. The microphone assembly 100 includes a housing 105, a substrate 110, an acoustic transducer (not shown), an integrated circuit (e.g., ASIC) 120 including an OTP fuse block 130, a voltage input terminal 170 of the ASIC 120, and a filter circuit 150. The housing includes an external interface with electrical contacts, e.g., a supply voltage contact 160 of the external interface. The OTP fuse block 130 includes one or more fuses for calibration of the integrated circuit. The microphone assembly further includes a protection circuit 140 placed in parallel to the OTP fuse block 130 of the microphone assembly 100. The filter circuit 150 includes an impedance connected in series between the supply voltage contact 160 and the voltage input terminal 170 of the ASIC 120.

The integrated circuit 120 is electrically coupled to the acoustic transducer (not shown) and receives an electrical signal from the acoustic transducer. The integrated circuit 120 may amplify or condition the signal before outputting a digital or analog electrical signal representative of the sensed acoustic activity. In some embodiments, the acoustic transducer may be a capacitive acoustic transducer, such as a microelectromechanical systems (MEMS) acoustic transducer including a backplate (not shown) and a diaphragm (not shown). In such embodiments, the integrated circuit 120 may generate an output signal indicative of the acoustic activity sensed by the MEMS transducer based on changes in capacitance between the backplate and the diaphragm. In various embodiments, the integrated circuit 120 may include an amplifier, analog-to-digital converter (ADC) (e.g., sigma delta modulator), filter circuitry configured to pass through some frequency ranges of the sensed signal and block other frequency ranges, etc. In some embodiments, the integrated circuit 120 may be a mixed-signal CMOS semiconductor device.

While multiple microphone devices may be manufactured with similar characteristics, each device generally differs in at least some aspects. In order to help provide uniform and predictable performance, the microphone devices can be configured after some or all of the manufacturing steps have been completed so that the final configuration data provided to the device reflects the actual construction and performance of the device. Microphone assembly 100 includes an OTP fuse block 130 including fuses that can be written via a one-time writing operation to provide the microphone assembly with configuration data. The OTP fuses 130 may be written by applying a voltage across the OTP fuses 130 sufficient to drive a fusing current through the fuses and burn the fuses such that, in combination, the fuses of the OTP fuse block 130 store a permanent representation of the configuration data usable by the microphone assembly 100 to modify operation to reflect the actual characteristics and performance of the final microphone assembly.

The filter circuit 150 provides a series impedance between the input terminal 160 and the input terminal 170 of the integrated circuit 120 that protects against RF interference. In some embodiments, the filter circuit 150 may be a first-order R-C filter circuit. The protection circuit 140 dynamically divides current between the OTP fuse block 130 and a load of the protection circuit 140. In this manner, the OTP fuse block 130 gets sufficient current to complete a fuse writing operation, but the integrated circuit 120 is not exposed to damaging currents when the writing operation is not occurring. An example implementation of microphone assembly 100 is discussed in detail below with reference to FIG. 3.

Figure 2:
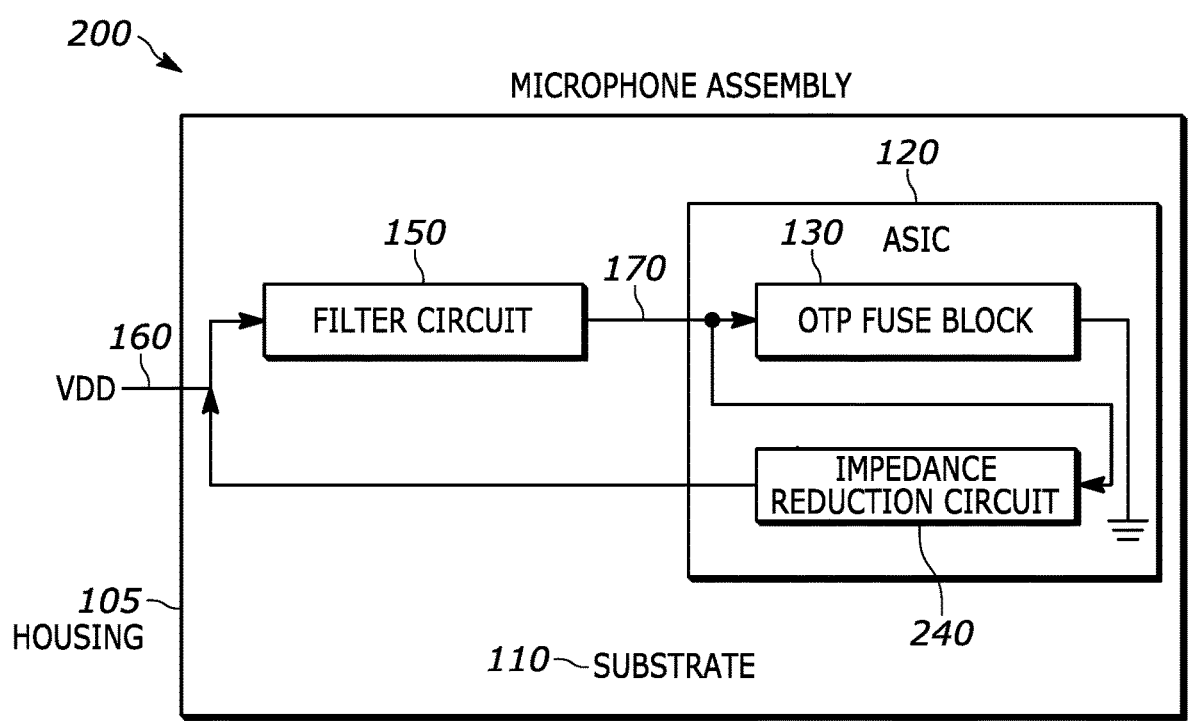
FIG. 2 is a block diagram of an example microphone assembly in which an impedance reduction circuit is placed in parallel to the filter circuit to reduce the effective impedance of the filter circuit.

FIG. 2 is a block diagram of a microphone assembly 200 which includes another example implementation for providing reliable OTP fuse burning. The microphone assembly 200 includes several similar components as the microphone assembly 100, which are indicated by like reference numerals. The microphone assembly 200 further includes an impedance reduction circuit 240, which may be implemented within the integrated circuit 120 or as a separate circuit. The impedance reduction circuit 120 connects in parallel to the filter circuit 150 in order to reduce the effective series impedance between the supply voltage contact 160 and the input terminal 170 of the integrated circuit 120 during the writing operation for the OTP fuses of the OTP fuse block 130. In some embodiments, the impedance reduction circuit 240 includes one or more switches or transistors. The switches connect one or more impedances in parallel to the package filter impedance between the supply voltage contact 160 of the microphone assembly and the input terminal 170 of the integrated circuit 120 during a writing operation. When activated, the switches effectively reduce the series impedance seen at the input terminal 170 of the integrated circuit 120 during the writing operation. Once the writing operation is complete, the parallel impedances can be disconnected, such that the higher series impedance and corresponding increased RF protection is restored between the supply voltage contact 160 and the integrated circuit 120. Example implementations of microphone assembly 200 are discussed in detail below with reference to FIGS. 4 and 5.

Figure 3:
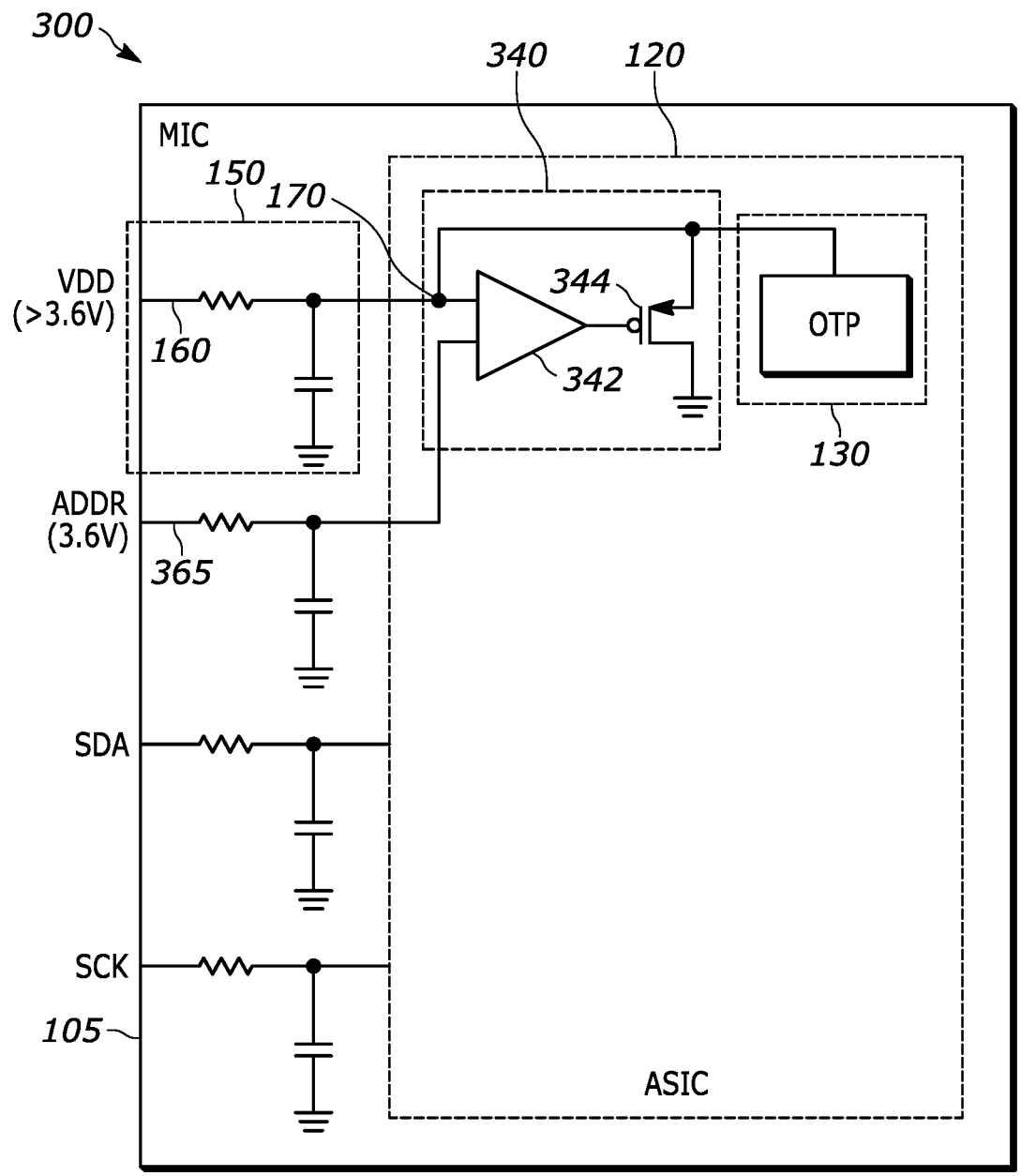
FIG. 3 is an example schematic diagram of one implementation of the microphone assembly of FIG. 1.

FIG. 3 is an example schematic diagram of a microphone assembly 300 in which the filter circuit 150 is implemented as a series impedance between the supply voltage contact 160 and an input terminal 170 of the integrated circuit 120. In the illustrated embodiment, series impedances are provided at the other input terminals as well (e.g., address (ADDR), data (SDA), and clock (SCK) terminals). It should be understood that, in various embodiments, filtering could be provided at less than all of the input terminals (e.g., one or more terminals).

The microphone assembly 300 includes a protection circuit 340 that includes a comparison circuit 342 and a dummy load 344. The protection circuit 340 is connected in parallel to the OTP fuse block 130. In some implementations, the comparison circuit 342 may be an amplifier, and the dummy load 344 may be a transistor (e.g., a PMOS transistor). The comparison circuit 342, when enabled, is configured to operate as a voltage regulator to fix the voltage level on the input terminal 170. In some embodiments, the fixed voltage level may be the same as the voltage supplied by an ADDR supply voltage contact 365 (e.g., 3.6V, in the illustrated example embodiment). In some implementations, the voltage on the ADDR supply voltage contact 365 is controlled to be less than the maximum tolerable voltage of the integrated circuit 120. Thus, the voltage regulation function of the comparison circuit 342 can prevent damage to the integrated circuit 120 even when the amplitude of a VDD supply voltage contact 160 is raised to a value higher than the voltage on the ADDR supply voltage contact 365 to successfully burn the OTP fuses during the writing operation. In this example, the ASIC 120 is configured to withstand a voltage of VDD=I*R+ADDR without suffering damage to the components of the ASIC 120, because the voltage regulation operation of the protection circuit 340 limits the voltage on the input terminal 170 of the integrated circuit 120 to a value of the voltage on ADDR. While the reference voltage in the illustrated embodiment is provided via the ADDR contact 365, in other embodiments, the reference voltage could be fixed or obtained from another source.

Until the writing operation for OTP fuses is enabled, the comparison circuit 342 operates the dummy load 344 such that the dummy load 344 sinks substantially all the current coming in through the filter circuit 150 to ground, with the OTP fuse block 130 drawing very little current. In some embodiments, the writing operation may be enabled through a serial communication interface on the integrated circuit, such as a communication interface utilizing the I²C protocol. When the writing operation for the OTP fuses is enabled, there is a spike in the current drawn by the fuse block 130, upon which the comparison circuit 342 operates the dummy load 344 to provide a high impedance, so that only a small current flows through the dummy load 344 and a larger current (sufficient to burn the OTP fuses 130) flows through the OTP fuse block 130 to complete the writing operation. Once the writing operation is completed, the comparison circuit 342 causes the majority of the current (e.g., substantially all of the current) to flow through the dummy load 344, thus, preventing the current from causing damage to the components of the integrated circuit 120.

Figure 4:
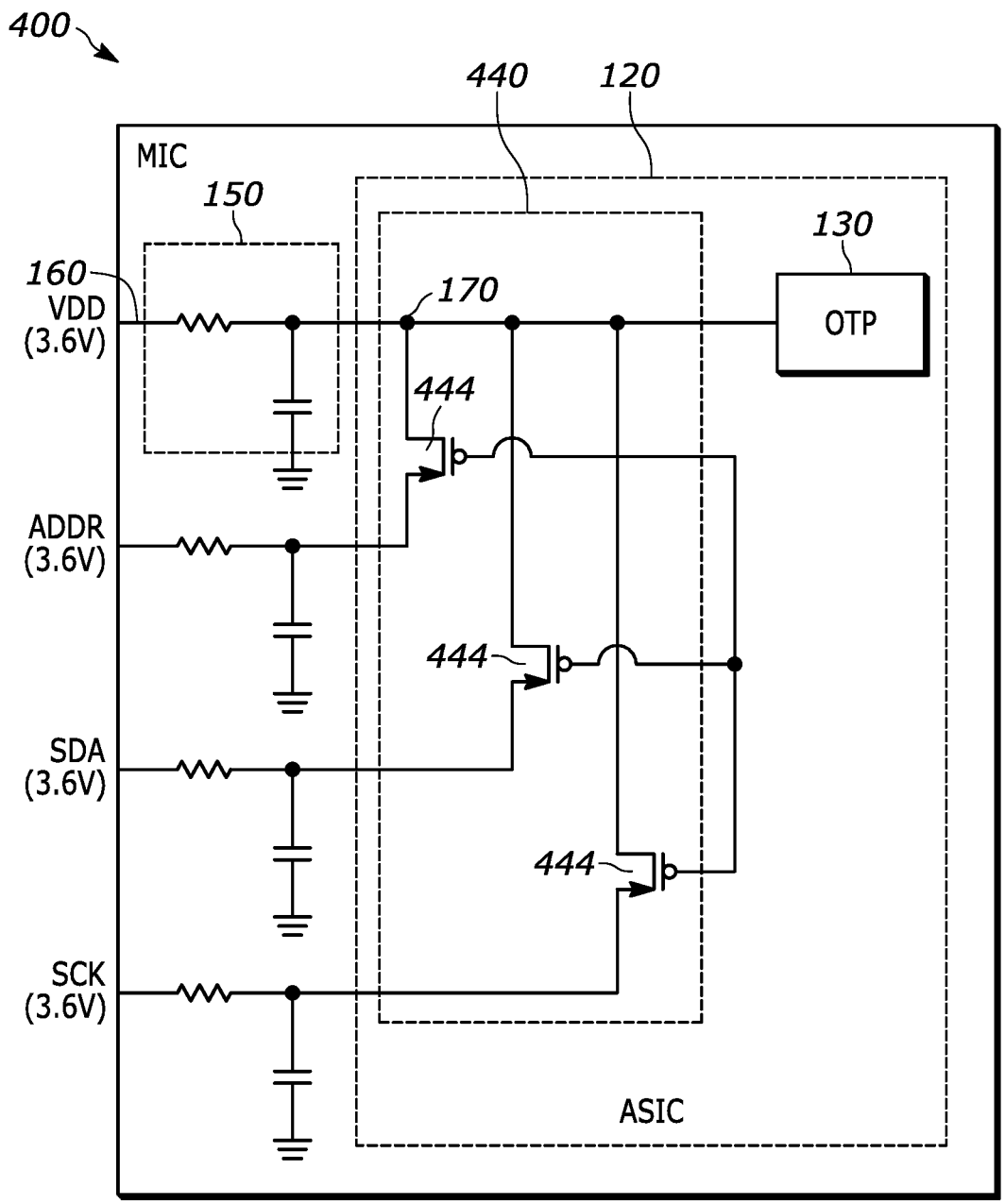
FIG. 4 is an example schematic diagram of an implementation of the microphone assembly of FIG. 2.

FIG. 4 is a schematic diagram of an example microphone assembly 400. Microphone assembly 400 includes an impedance reduction circuit 440 in parallel to the filter circuit 150 that includes one or more transistors 444 each coupled to an input terminal 170 of the integrated circuit 120. The transistors 444 are each configured to switch an impedance into and out of parallel connection with the series impedance on the VDD supply voltage contact 160. Upon activation of the writing operation of the OTP fuse block 130, the transistors 444 are activated, causing the impedances on the other input contacts to be placed in parallel with the series impedance on the VDD supply voltage contact 160. The transistors 444 may be activated in response to the write command or directly activated using an externally transmitted signal. This effectively reduces the series impedance between the VDD supply voltage contact 160 and the OTP fuse block 130 during the writing operation, allowing a smaller voltage to be applied to the VDD supply voltage contact 160 to successfully complete the OTP writing operation. In some implementations, the number and value of impedances placed in parallel during the writing operation may be sufficient to reduce the series impedance seen by the OTP fuse block 130 to a value less than a threshold impedance for a successful OTP writing operation.

Figure 5:
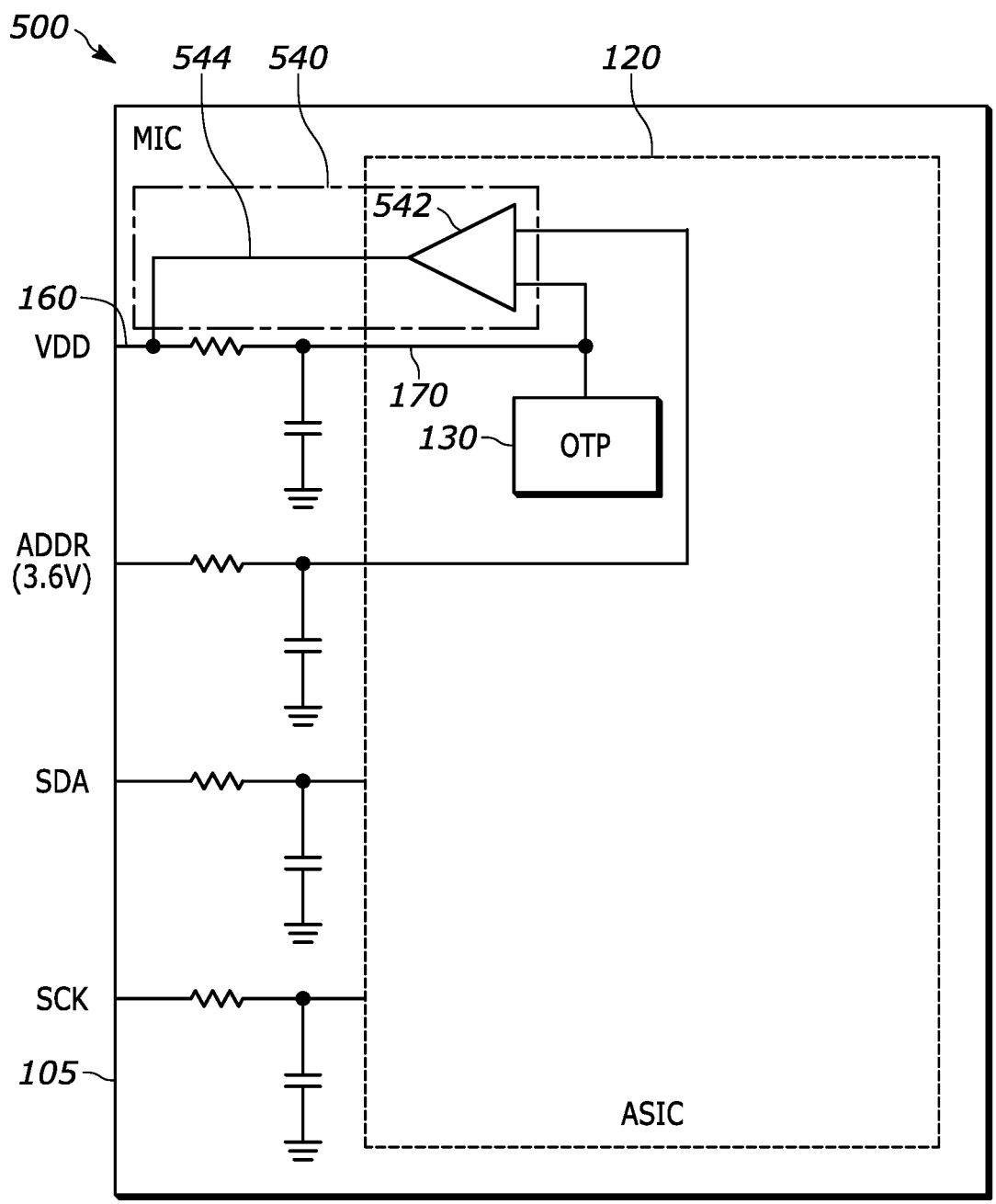
FIG. 5 is an example schematic diagram of another implementation of the microphone assembly of FIG. 2.

FIG. 5 is a schematic diagram of a microphone assembly 500. An impedance reduction circuit 540 includes an amplifier 542 connected between an input terminal 170 of the integrated circuit 120, and a supply voltage contact 160 through a loop connection wire 544. In addition to providing reduction in effective impedance of the filter, the amplifier 542 in the embodiment of FIG. 5 also compensates for a voltage drop across the filter circuit by forcing a voltage at the input terminal 170 to be the same as the voltage applied to the first supply voltage contact 160. Thus, the writing procedure for the OTP fuses can draw the needed amount of current without increasing the voltage on the VDD supply voltage contact 160 to a higher level than used with existing procedures. This protects the integrated circuit 120 from damage during OTP fuse programming. It also allow the package filter impedance to be increased for enhanced RF suppression.

Figure 6:
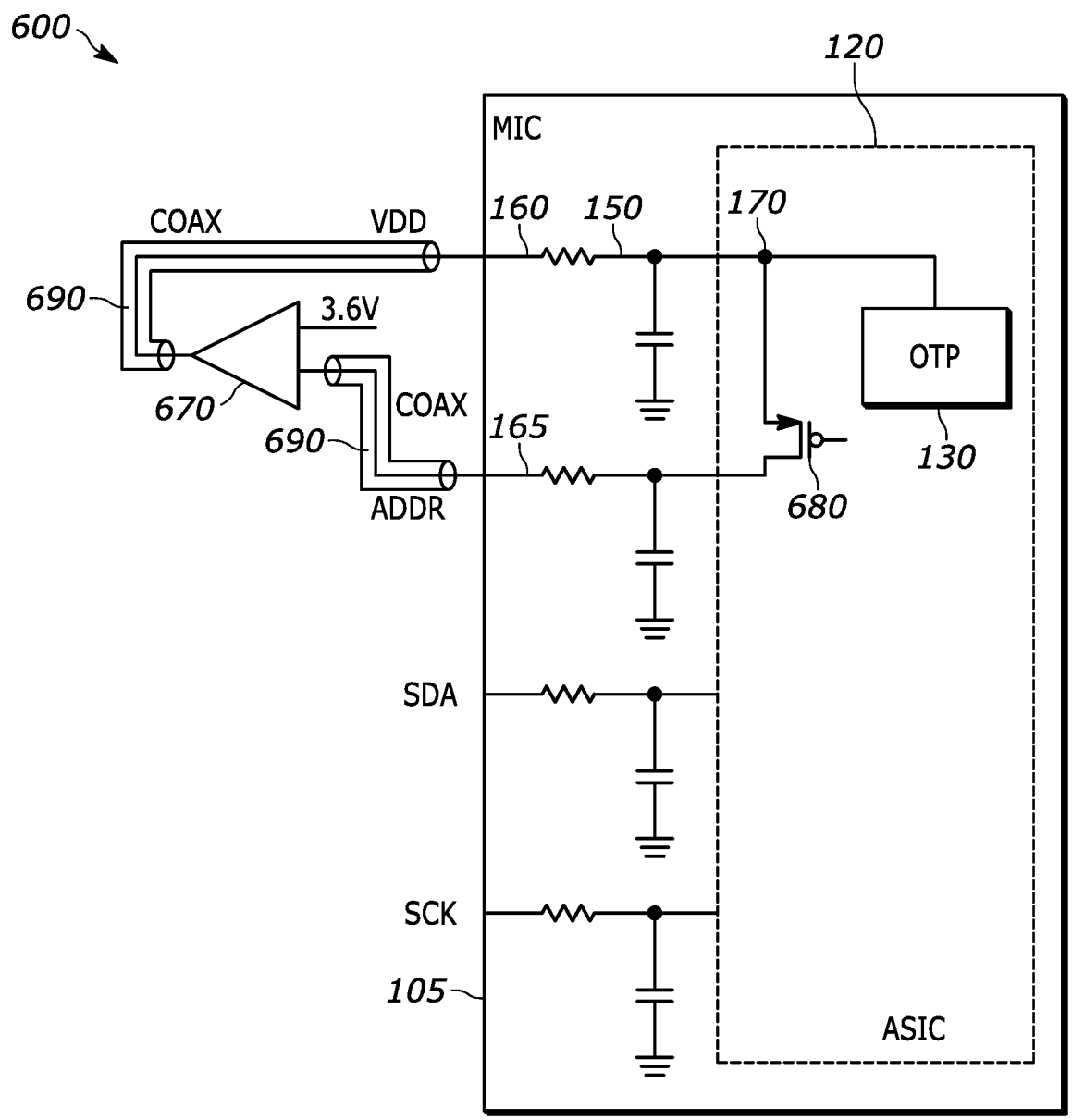
FIG. 6 is an example schematic diagram of an implementation of a microphone assembly which uses external components to implement a resistance bootstrapping circuit to enable reliable OTP fuse programming.

FIG. 6 is a schematic diagram of a microphone assembly 600 that utilizes external components for resistance bootstrapping. A circuit element 680 (e.g., transistor) is coupled to the input terminal 170 of the integrated circuit 120, and is configurable to couple the input terminal 170 of the integrated circuit 120 to a second input contact 165 of the external interface of the housing 105 when the programming mode of the OTP fuse block 130 is ongoing. The comparison circuit 670 regulates the voltage on the input terminal 170 of the integrated circuit 120 to track a reference voltage during the programming mode of the OTP fuse block 130. The comparison circuit 670 may be an amplifier, and the amplifier output may be higher than what the integrated circuit 120 would see at the input terminal 170 after the filter circuit 150. An advantage of this implementation is that it provides an area efficient solution from the point of view of implementing the integrated circuit 120, as the majority of the solution is implemented in external components.

Figure 7:
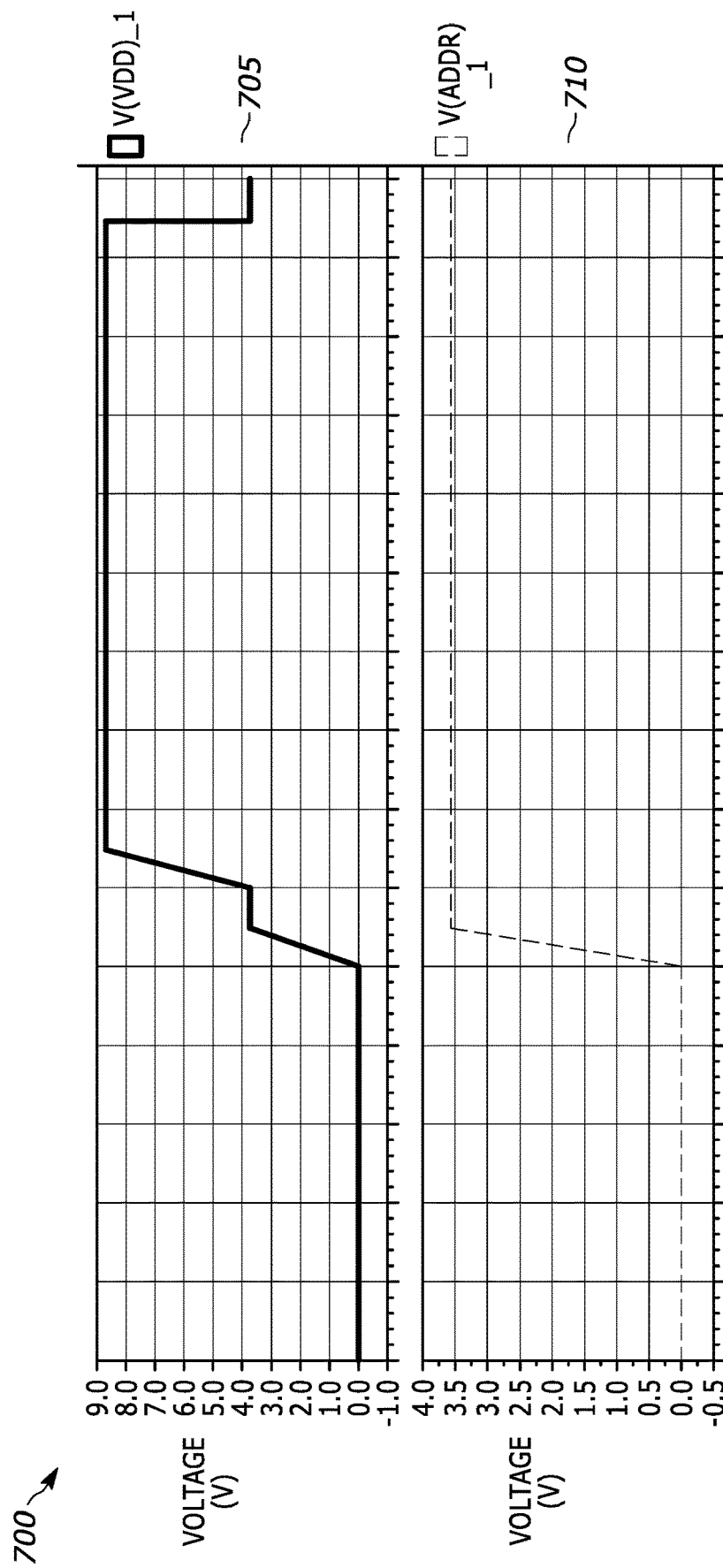
FIG. 7 is a graphical waveform plot of various current and voltage values during the writing operation for OTP fuses in the microphone assembly of FIG. 3.
Figure 7:
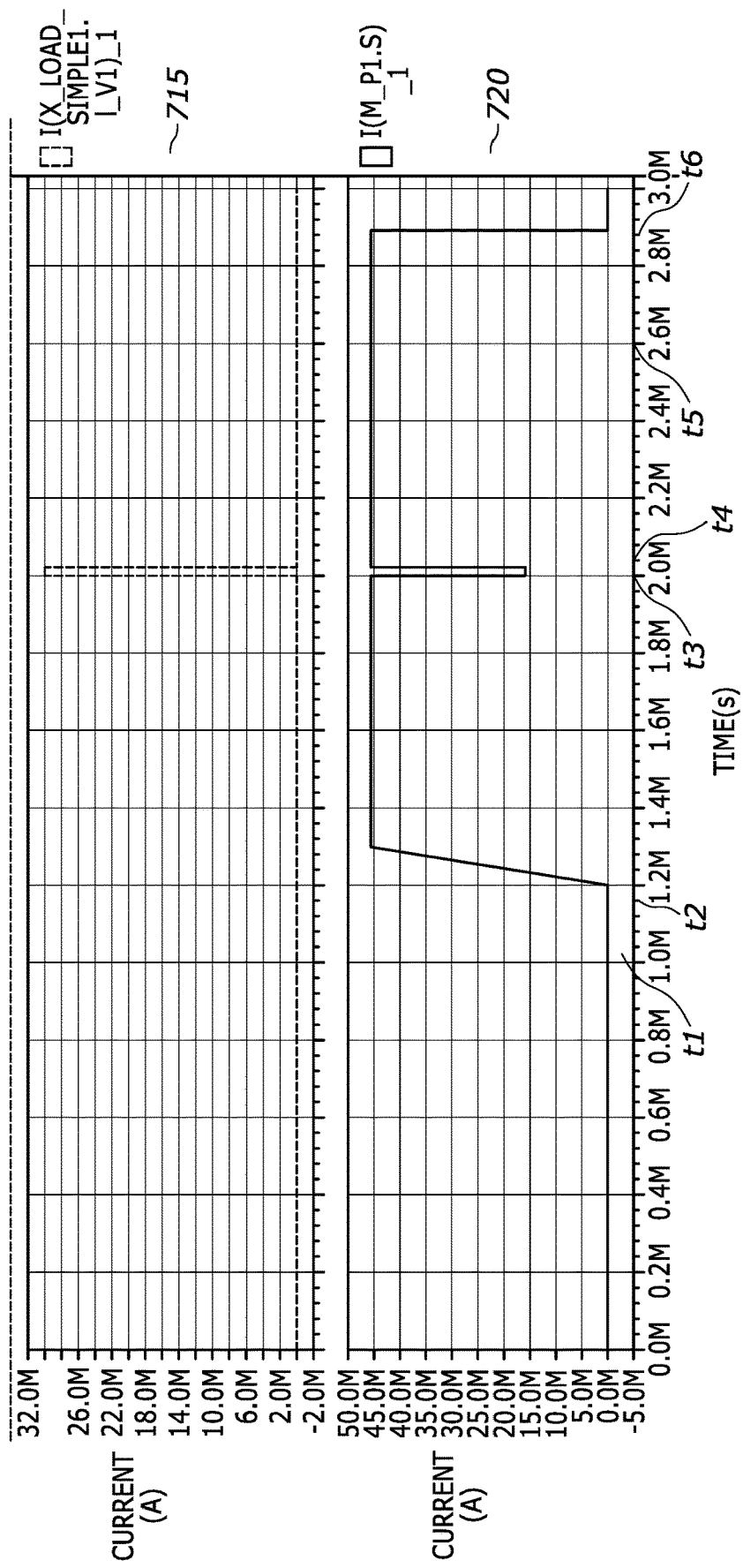

FIG. 7 is a graphical waveform plot of various current and voltage changes with respect to time that occur during the writing operation for OTP fuses for the microphone assembly 300. The voltage applied to the VDD supply voltage contact 160 over time is shown in plot 705, while the voltage applied to an ADDR supply voltage contact 365 over time is shown in plot 710. The current flowing through the OTP fuse block 130 over time is depicted in plot 715, while the current flowing into the protection circuit 140 is depicted in plot 720.

At time t1 in FIG. 7 (shown along the horizontal time axis), the voltages applied to the VDD supply voltage contact 160 and the ADDR supply voltage contact 365 are both set to a first voltage level of 3.6V. There is no current flow through the protection circuit 140 at this time. Then the voltage on the VDD supply voltage contact 160 is increased to a second voltage level of 8.6V at time t2. This starts the flow of a first current starting at time t2 into the protection circuit 140, with the first current being substantially equal to the entire current, as depicted in the transistor current waveform plot 720. Note that at this time, the OTP fuses are drawing negligible, if any, current. When the writing operation for OTP fuses is enabled at time t3, then the OTP current waveform plot 715 shows a current spike caused by the burning of the poly-fuses of the OTP memory, while during the same time period there is a corresponding dip in the current being drawn by the protection circuit 140, as shown in the protection circuit 140 current waveform plot 720. Thus, FIG. 7 depicts that during the writing operation for OTP fuses, the protection circuit 140 controls the dynamic sharing of the current between the protection circuit 140 and the OTP fuse block 130 of the integrated circuit 120. The writing of the OTP fuses is completed at time t4, at which time the protection circuit 140 starts drawing practically all of the current, as can be seen in plots 715 and 720. At time t5, the programming mode of OTP fuses 130 is deactivated. In the example of FIG. 7, the voltage on the VDD supply voltage contact 160 is brought down to the first level (the same level as the voltage on the ADDR supply voltage contact 365) at time t6, which stops the current from flowing in the protection circuit 140.

Some embodiments relates to a microphone assembly that includes a housing having: (1) an external interface with electrical supply voltage contacts; (2) a transducer disposed in the housing and configured to convert sound into an electrical signal; (3) a filter circuit including an impedance; and (4) an integrated circuit disposed in the housing and electrically coupled to the transducer. The integrated circuit has a voltage input terminal electrically coupled to a supply voltage contact of the external interface via the filter circuit. The integrated circuit includes a fuse block having a one-time programmable (OTP) fuse configurable to fix a configuration of the microphone assembly upon configuring the OTP fuse in a programming mode of operation during which a voltage applied to the supply voltage contact is increased relative to a voltage applied to the supply voltage contact in a normal mode of operation. The microphone assembly further includes a protection circuit including a comparison circuit and a dummy load in parallel with the OTP fuse. The protection circuit is configured to regulate a voltage at the voltage input terminal of the integrated circuit during the programming mode of operation based on a comparison of a voltage at the voltage input terminal with a reference voltage. The voltage on the voltage input terminal of the integrated circuit tracks the reference voltage during the programming mode of operation.

Some embodiments relate to a microphone assembly that includes a housing having a plurality of electrical supply voltage contacts on an external interface of the housing, a filter circuit comprising a first impedance. The assembly further includes an integrated circuit disposed in the housing. The integrated circuit is electrically coupled to a transducer and to a supply voltage contact of the external interface via the filter circuit such that current flows from the supply voltage contact to a voltage input terminal of the integrated circuit via a first impedance of the filter circuit. The integrated circuit further includes an impedance reduction circuit configured to be connected in parallel to the first impedance of the filter circuit during a programming mode of operation, and a fuse block having a one-time programmable (OTP) fuse configurable to fix a calibration of the microphone assembly upon configuring the OTP fuse in a programming mode of operation during which a voltage is applied to the supply voltage contact when the impedance reduction circuit is connected in parallel to the first impedance of the filter circuit. The impedance reduction circuit reduces an effective impedance of the filter circuit during the programming mode of operation to facilitate configuration of the OTP fuse.

Some embodiments relate to a microphone assembly including a housing having a plurality of electrical supply voltage contacts on an external interface of the housing. The assembly further includes a transducer disposed in the housing and configured to convert sound into an electrical signal and a filter circuit including an impedance. The assembly further includes, an integrated circuit disposed in the housing. The integrated circuit is electrically coupled to the transducer and to a supply voltage contact of the external interface via the filter circuit such that current flows from the supply voltage contact to a voltage input terminal of the integrated circuit via the impedance of the filter circuit. The integrated circuit further includes a fuse block coupled to the voltage input terminal, the fuse block having a one-time programmable (OTP) fuse configurable to fix a calibration of the microphone assembly upon configuring the OTP fuse in a programming mode of operation. The microphone assembly further includes a circuit element coupled to the voltage input terminal of the integrated circuit and configurable to couple the voltage input terminal of the integrated circuit to a second contact of the external interface during the programming mode of operation. The microphone assembly further includes a comparison circuit having an input coupled to the second contact of the external interface. The comparison circuit has an output coupled to the supply voltage contact of the external interface and configured to regulate a voltage at the voltage input terminal of the integrated circuit during the programming mode of operation based on a comparison of the voltage at the second contact of the external interface with a reference voltage. The voltage on the voltage input terminal of the integrated circuit tracks the reference voltage during the programming mode of operation.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A microphone assembly comprising:
a housing having an external interface with electrical contacts;
a transducer disposed in the housing and configured to convert sound into an electrical signal;
a filter circuit comprising an impedance;
an integrated circuit disposed in the housing and electrically coupled to the transducer, the integrated circuit having a voltage input terminal electrically coupled to a supply voltage contact of the external interface via the filter circuit, the integrated circuit includes a fuse block having a one-time programmable (OTP) fuse configurable to fix a configuration of the microphone assembly upon configuring the OTP fuse in a programming mode of operation during which a voltage applied to the supply voltage contact is increased relative to a voltage applied to the supply voltage contact in a normal mode of operation; and
a protection circuit including a comparison circuit and a dummy load in parallel with the OTP fuse, the protection circuit configured to regulate a voltage at the voltage input terminal of the integrated circuit during the programming mode of operation based on a comparison of a voltage at the voltage input terminal with a reference voltage,
wherein the voltage on the voltage input terminal of the integrated circuit tracks the reference voltage during the programming mode of operation.

2. The assembly of claim 1, wherein the dummy load is a three-terminal semiconductor device having an input terminal coupled to an output of the comparison circuit, the comparison circuit having a voltage input coupled to the voltage input terminal of the integrated circuit and a reference input coupled to a reference voltage node, wherein the comparison circuit is configured to control the dummy load based on the comparison.

3. The assembly of claim 2, wherein the comparison circuit controls the dummy load to maintain a constant current supplied from the supply voltage contact of the external interface to the voltage input terminal of the integrated circuit via the filter circuit during the programming mode.

4. The assembly of claim 1, wherein the protection circuit is configured to operate in a low power mode during the normal mode of operation.

5. The assembly of claim 4, wherein the integrated circuit includes a communication interface configured to receive a control signal to activate and deactivate the programming mode of operation.

6. The assembly of claim 1, wherein the filter circuit is at least partially embedded in a substrate of the housing.

7. The assembly of claim 6, wherein the filter circuit comprises an RC filter circuit.

8. The assembly of claim 1, wherein the integrated circuit is configured to accommodate a maximum voltage, applied to the supply voltage contact of the external interface during the programming mode of operation, specified by $V_{DD}=IR+V_{REF}$ where I is greater than an expected peak current spike required to configure the OTP fuse, R is a impedance of the filter circuit and $V_{REF}$ is the reference voltage.

9. The assembly of claim 1, wherein the protection circuit constitutes part of the integrated circuit.

10. A microphone assembly comprising:
a housing having a plurality of electrical contacts on an external interface of the housing;
a transducer disposed in the housing and configured to convert sound into an electrical signal;
a filter circuit comprising a first impedance;
an integrated circuit disposed in the housing, the integrated circuit electrically coupled to the transducer and to a supply voltage contact of the external interface via the filter circuit such that current flows from the supply voltage contact to a voltage input terminal of the integrated circuit via the first impedance of the filter circuit, the integrated circuit comprising:
an impedance reduction circuit configured to be connected in parallel to the first impedance of the filter circuit during a programming mode of operation; and
a fuse block having a one-time programmable (OTP) fuse configurable to fix a calibration of the microphone assembly upon configuring the OTP fuse in a programming mode of operation during which a voltage is applied to the supply voltage contact when the impedance reduction circuit is connected in parallel to the first impedance of the filter circuit,
wherein the impedance reduction circuit reduces an effective impedance of the filter circuit during the programming mode of operation to facilitate configuration of the OTP fuse.

11. The assembly of claim 10,
the filter circuit comprises a plurality of impedances each coupled to a corresponding electrical contact of the external interface,
wherein the impedance reduction circuit comprises a plurality of transistors, each transistor coupled to the supply voltage contact of the external interface via the first impedance and to a corresponding other electrical contact via a corresponding one of the plurality of impedances, wherein the transistors are configured to reduce the effective impedance of the filter circuit between the supply voltage contact and the fuse block during the programming mode of operation.

12. The assembly of claim 11, wherein the effective impedance of the filter circuit is reduced below a threshold required to configure the OTP fuse when the plurality of transistors are activated during the programming mode of operation.

13. The assembly of claim 11, wherein the plurality of transistors constitute part of the integrated circuit.

14. The assembly of claim 10, wherein the impedance reduction circuit comprises an amplifier comprising a first input coupled to the supply voltage contact of the external interface via the filter circuit, a reference input coupled to a reference voltage node, and an output connected to the supply voltage contact, wherein the first impedance of the filter circuit is bootstrapped by the amplifier to reduce the effective impedance of the filter circuit during the programming mode of operation.

15. The assembly of claim 10, wherein the filter circuit is at least partially embedded in a substrate of the housing and the impedance reduction circuit is either an integrated portion of the integrated circuit or a separate circuit.

16. A microphone assembly comprising:
a housing having a plurality of electrical contacts on an external interface of the housing;
a transducer disposed in the housing and configured to convert sound into an electrical signal;
a filter circuit comprising an impedance;

an integrated circuit disposed in the housing, the integrated circuit electrically coupled to the transducer and to a supply voltage contact of the external interface via the filter circuit such that current flows from the supply voltage contact to a voltage input terminal of the integrated circuit via the impedance of the filter circuit, the integrated circuit comprising a fuse block coupled to the voltage input terminal, the fuse block having a one-time programmable (OTP) fuse configurable to fix a calibration of the microphone assembly upon configuring the OTP fuse in a programming mode of operation;

a circuit element coupled to the voltage input terminal of the integrated circuit and configurable to couple the voltage input terminal of the integrated circuit to a second contact of the external interface during the programming mode of operation;

a comparison circuit having an input coupled to the second contact of the external interface, the comparison circuit having an output coupled to the supply voltage contact of the external interface and configured to regulate a voltage at the voltage input terminal of the integrated circuit during the programming mode of operation based on a comparison of the voltage at the second contact of the external interface with a reference voltage, wherein the voltage on the voltage input terminal of the integrated circuit tracks the reference voltage during the programming mode of operation.

17. The assembly of claim 16 further comprising a second filter circuit having a second impedance coupled to the second contact of the external interface, wherein the circuit element couples the voltage input terminal of the integrated circuit to the second contact of the external interface via the second filter circuit during the programming mode of operation.

18. The assembly of claim 17, wherein the circuit element is a transistor integrated with the integrated circuit, and wherein the second filter circuit is at least partially embedded in a substrate of the housing.

19. The assembly of claim 18, wherein the comparison circuit is external to the microphone assembly.

20. The assembly of claim 17, wherein the comparison circuit is external to the microphone assembly and wherein the comparison circuit is coupled to the supply voltage contact and the second contact of the external interface via coaxial cables.

* * * * *